(12) United States Patent
Wang et al.

(10) Patent No.: US 8,309,474 B1
(45) Date of Patent: Nov. 13, 2012

(54) ULTRAFAST LASER ANNEALING WITH REDUCED PATTERN DENSITY EFFECTS IN INTEGRATED CIRCUIT FABRICATION

(75) Inventors: Yun Wang, Saratoga, CA (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 2 days.

(21) Appl. No.: 13/134,408

(22) Filed: Jun. 7, 2011

(51) Int. Cl.
*H01L 21/00* (2006.01)
*H01L 21/84* (2006.01)
*H01L 21/20* (2006.01)
*H01L 21/36* (2006.01)
*H01L 21/425* (2006.01)

(52) U.S. Cl. ........ 438/795; 438/166; 438/308; 438/486; 438/487; 438/530; 438/799

(58) Field of Classification Search .................. None
See application file for complete search history.

(56) References Cited

U.S. PATENT DOCUMENTS

| | | | |
|---|---|---|---|
| 4,234,356 A | 11/1980 | Auston et al. | |
| 4,375,993 A | 3/1983 | Mori et al. | |
| 5,401,666 A | 3/1995 | Tsukamoto | |
| 5,612,251 A | 3/1997 | Lee | |
| 5,767,003 A | 6/1998 | Noguchi | |
| 5,803,965 A | 9/1998 | Yoon | |
| 5,908,307 A | 6/1999 | Talwar et al. | |
| 5,930,617 A | 7/1999 | Wu | |
| 5,959,779 A | 9/1999 | Yamazaki et al. | |
| 6,066,516 A | 5/2000 | Miyasaka | |
| 6,281,057 B2 | 8/2001 | Aya et al. | |
| 6,303,476 B1 | 10/2001 | Hawryluk et al. | |
| 6,335,509 B1 | 1/2002 | Jung | |
| 6,365,476 B1 | 4/2002 | Talwar et al. | |
| 6,366,308 B1 | 4/2002 | Hawryluk et al. | |
| 6,368,947 B1 | 4/2002 | Yu | |
| 6,383,956 B2 | 5/2002 | Hawryluk et al. | |
| 6,479,821 B1 | 11/2002 | Hawryluk et al. | |
| 6,514,339 B1 | 2/2003 | Jung | |
| 6,521,501 B1 | 2/2003 | Erhardt et al. | |
| 6,524,977 B1 | 2/2003 | Yamazaki et al. | |
| 6,531,681 B1 | 3/2003 | Markle et al. | |
| 6,548,361 B1 | 4/2003 | En et al. | |
| 6,558,991 B2 | 5/2003 | Yamazaki et al. | |
| 6,632,749 B2 | 10/2003 | Miyasaka et al. | |
| 6,693,257 B1 | 2/2004 | Tanaka | |
| 6,730,550 B1 | 5/2004 | Yamazaki et al. | |
| 6,747,245 B2 | 6/2004 | Talwar et al. | |
| 6,849,831 B2 * | 2/2005 | Timans et al. ............... 219/390 |
| 6,974,731 B2 | 12/2005 | Yamazaki et al. | |
| 6,987,240 B2 | 1/2006 | Jennings et al. | |

(Continued)

*Primary Examiner* — N Drew Richards
*Assistant Examiner* — Michael Jung
(74) *Attorney, Agent, or Firm* — Opticus IP Law PLLC

(57) ABSTRACT

Systems and methods for performing ultrafast laser annealing in a manner that reduces pattern density effects in integrated circuit manufacturing are disclosed. The method includes scanning at least one first laser beam over the patterned surface of a substrate. The at least one first laser beam is configured to heat the patterned surface to a non-melt temperature $T_{nonmelt}$ that is within about 400° C. of the melt temperature $T_{melt}$. The method also includes scanning at least one second laser beam over the patterned surface and relative to the first laser beam. The at least one second laser beam is pulsed and is configured to heat the patterned surface from the non-melt temperature provided by the at least one first laser beam up to the melt temperature.

27 Claims, 15 Drawing Sheets

U.S. PATENT DOCUMENTS

| | | |
|---|---|---|
| 7,005,601 B2 | 2/2006 | Jennings |
| 7,098,155 B2 | 8/2006 | Talwar et al. |
| 7,279,721 B2 | 10/2007 | Jennings et al. |
| 7,482,254 B2 | 1/2009 | Bakeman |
| 7,494,942 B2 | 2/2009 | Talwar et al. |
| 7,514,305 B1 * | 4/2009 | Hawryluk et al. ............ 438/166 |
| 7,595,208 B2 | 9/2009 | Jennings et al. |
| 8,026,519 B1 | 9/2011 | Anikitchev et al. |
| 2002/0048864 A1 | 4/2002 | Yamazaki et al. |
| 2004/0097103 A1 | 5/2004 | Imai et al. |
| 2004/0198028 A1 | 10/2004 | Tanaka et al. |
| 2004/0253838 A1 | 12/2004 | Yamazaki et al. |
| 2007/0158315 A1 | 7/2007 | Tanaka et al. |
| 2008/0286982 A1 * | 11/2008 | Li et al. ......................... 438/782 |
| 2009/0034071 A1 | 2/2009 | Jennings et al. |
| 2009/0081418 A1 * | 3/2009 | Allen et al. ................. 428/195.1 |
| 2009/0311880 A1 | 12/2009 | Jennings et al. |

* cited by examiner

*PRIOR ART*

ULTRAFAST LASER ANNEALING WITH
REDUCED PATTERN DENSITY EFFECTS IN
INTEGRATED CIRCUIT FABRICATION

FIELD

The present disclosure relates generally to annealing as used in semiconductor manufacturing to fabricate integrated circuits, and in particular relates to ultrafast laser annealing that reduces pattern density effects in integrated circuit fabrication.

BACKGROUND ART

Conventional nanosecond pulsed-laser melt annealing ("conventional melt laser annealing") offers an ultra-low thermal budget, a high dopant activation and super-abrupt junctions that are ideal for advanced integrated circuit (IC) chip fabrication. In practice, however, it is difficult to implement this type of annealing on patterned wafers due to large temperature non-uniformities that can arise from spatial variations in the optical and thermal properties of the IC chip. These adverse effects are referred to in the art as "pattern density effects."

Pattern density effects can be mitigated by using an absorber layer or a phase-switch layer. The absorber layer can significantly improve optical absorption uniformity, but the process window is still limited by the pattern density effects from inhomogeneous thermal properties. In particular, the short heat diffusion length (~1 um) associated with the nanosecond pulse duration is not sufficient to average out spatial variations in the material properties of an IC chip during manufacturing.

For example, FIG. 1 shows a schematic cross-sectional view of a portion of a silicon substrate (wafer) 10 with a surface 11 that supports a patterned surface 12, with the patterned surface being subjected to conventional melt laser annealing. Patterned surface 12 includes a first poly gate G1 atop substrate surface 11 and a second poly gate G2 atop a field-oxide region 16 formed in substrate surface 11. An absorber layer 20 caps the two poly gates G1 and G2. A conventional laser annealing beam 30 scans across the wafer 10 in the direction of arrow 31 and heats the two poly gates G1 and G2.

FIG. 2 is a bar-graph plot of the maximum surface temperature $T_{SM}(K)$ of patterned wafer surface 12 at poly gates G1 and G2 as calculated by a computer simulation of the conventional melt laser annealing process. FIG. 2 shows how the capped poly gate G2 overheats due to poor thermal conductivity of the underlying field-oxide region 16, as compared to the poly gate G1 that resides directly on the silicon wafer. The bar-graph plot of FIG. 2 shows that such overheating due to pattern density effects can be more than 200° C. for the conventional melt laser annealing process. The addition of a phase-switch layer can mitigate the pattern density effects to some extent by self-regulating the light absorption at the overheated region. However, the use of such phase-switch layer introduces substantial process complexity and cost.

SUMMARY

An aspect of the disclosure is a method of annealing a semiconductor substrate having a patterned surface and a melt temperature. The method include scanning at least one first laser beam over the patterned surface, the at least one first laser beam configured to heat the patterned surface to a non-melt temperature $T_{nonmelt}$ that is within about 400° C. of the melt temperature. The method also includes scanning at least one second laser beam over the patterned surface and relative to the first laser beam, the at least one second laser beam being pulsed and configured to heat the patterned surface from the non-melt temperature up to the melt temperature.

Another aspect of the disclosure is a system for laser annealing a semiconductor substrate having a patterned surface and a melt temperature. The system includes a first laser system configured to generate at least one first laser beam and scan the at least one first laser beam over the patterned surface. The at least one first laser beam is configured to heat the patterned surface to a non-melt temperature $T_{nonmelt}$ that is within about 400° C. of the melt temperature. The system also includes a second laser system configured to generate at least one second laser beam and scan the at least one second laser beam relative to the first laser beam. The at least one second laser beam is pulsed (i.e., is comprised of light pulses) and is configured to heat the patterned surface from the non-melt temperature up to the melt temperature.

Another aspect of the disclosure is a method of laser annealing a semiconductor substrate having a patterned surface. The method includes selecting an acceptable temperature variation $\Delta T$ for the patterned surface. The method also includes determining the minimum non-melt temperature $T_{nonmelt}$ via the relationship:

$$\Delta T \approx \left( \frac{T_{melt} - T_{nonmelt}}{T_{melt} - T_{sub}} \right) \cdot \Delta T_{melt}$$

where $\Delta T_{melt}$ is a patterned surface temperature variation due to pattern density effects that would arise using conventional single-beam melt laser annealing, $T_{melt}$ is a melt temperature of the substrate, and $T_{sub}$ is an initial substrate surface temperature. The method also includes performing laser annealing by scanning at least one first laser beam to pre-heat the patterned surface to a melt temperature in the range from the minimum non-melt temperature $T_{nonmelt}$ and a temperature about 50° C. below the melt temperature, and by scanning at least one second pulsed laser beam relative to the first laser beam to heat the patterned surface to the substrate melt temperature $T_{melt}$.

Additional features and advantages of the disclosure are set forth in the detailed description that follows, and in part will be readily apparent to those skilled in the art from that description or recognized by practicing the embodiments as described herein, including the detailed description which follows, the claims, as well as the appended drawings. The claims constitute part of this specification, and are hereby incorporated into the detailed description by reference.

It is to be understood that both the foregoing general description and the following detailed description presented below are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure. The claims set forth below constitute part of this specification and in particular are incorporated into the detailed description set forth below.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure. In some of the Figures, Cartesian coordinates are provided for the sake of reference and are not intended as providing limitations on specific directions and orientations of the systems and methods described herein. The claims as set forth below are incorporated into and constitute part of this detailed description.

In the discussion below, the term "semiconductor substrate" and "wafer" are synonymous and used interchangeably. Likewise, the terms "substrate surface" and "wafer surface" are synonymous and used interchangeably, with "substrate surface" being shorthand for "semiconductor substrate surface." The term "wafer" is shorthand for "semiconductor wafer" such as used in the fabrication of integrated circuit devices. An exemplary wafer is a silicon wafer. The letter "K" is used below and in the Figures as shorthand for "degrees Kelvin".

Figure 3:
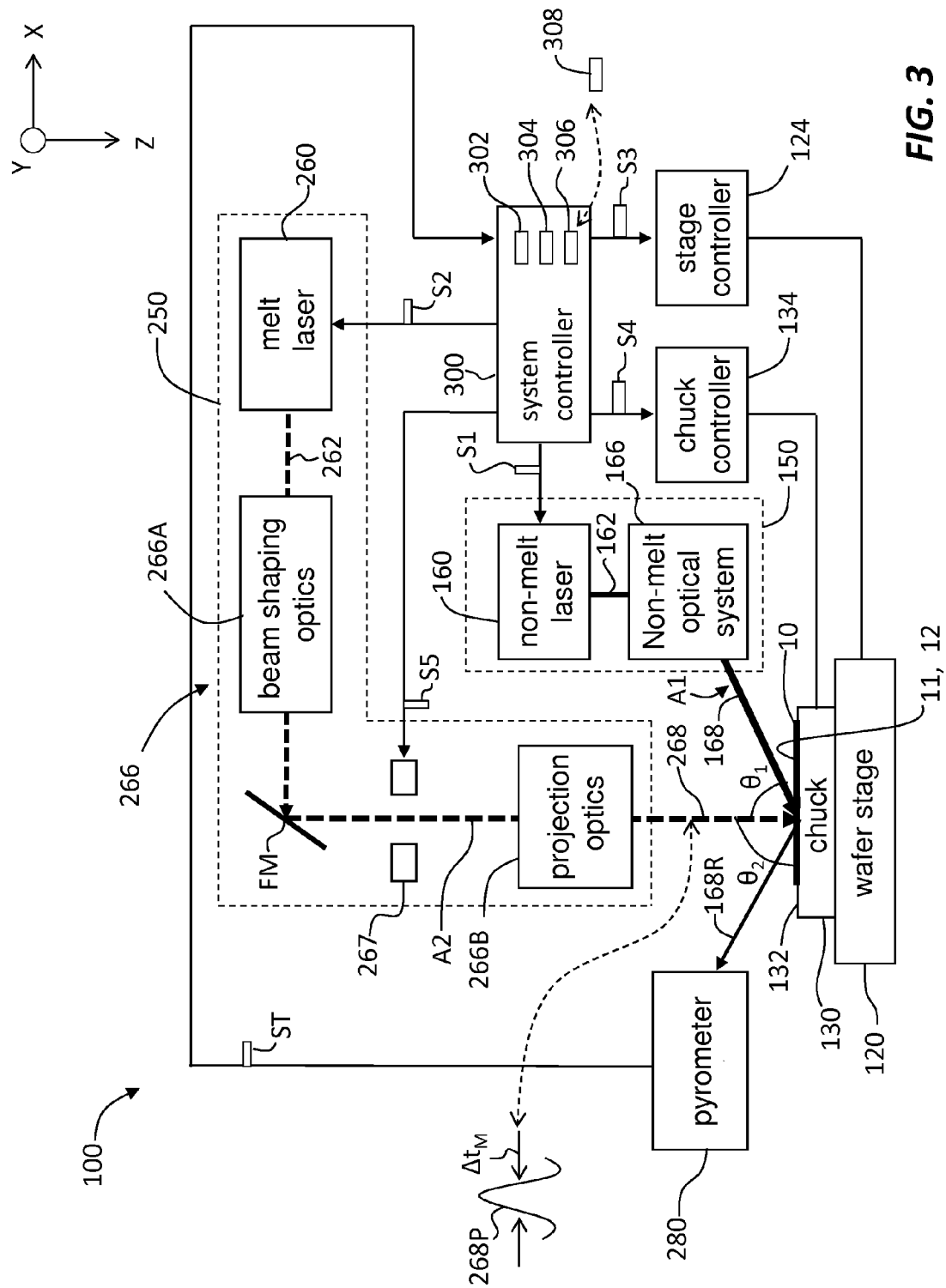
FIG. 3 is a schematic diagram of an example ultrafast laser annealing system according to the disclosure.

FIG. 3 is a schematic diagram of an example ultrafast laser annealing system ("system") 100 according to the disclosure. System 100 includes a wafer stage 120 that operably supports a chuck 130 having an upper surface 132. Wafer stage 120 is configured to move in the X-Y plane and optionally in the Z-direction. Chuck upper surface 132 is configured to operably support a wafer 10 having a planar surface 11 that operably supports a patterned wafer surface 12 (hereinafter, "wafer surface 12" or "substrate surface 12"). Example wafer surfaces 12 are illustrated in FIG. 4D, FIG. 6A through FIG. 6D. Here, wafer surface 12 can have any pattern beyond simply a flat planar surface 11 that is associated with the various stages of fabricating IC chips.

In an example, chuck 130 is heated so that wafer 10 can be pre-heated. Wafer stage 120 is operably connected to wafer stage controller 124 and chuck 130 is operably connected to a chuck controller 134.

System 100 also includes a first laser system 150 configured to generate at least one first laser beam 168 used to pre-heat wafer surface 12 by raising the wafer surface temperature $T_S$, which in an example is in the range from about 50° C. below the wafer melt temperature $T_{melt}$ to about 400° C. below the wafer melt temperature $T_{melt}$. Accordingly, first laser system 150 is hereafter referred to as the non-melt laser system 150 and the at least one first laser beam is referred to as the at least one non-melt laser beam 168.

Non-melt laser system 150 includes a non-melt laser 160 and a non-melt optical system 166 that defines a first optical axis A1. The non-melt laser 160 can include a diode laser or a $CO_2$ laser, such as a continuous-wave (CW) p-polarized 10.6 micron $CO_2$ laser. Axis A1 can be oriented so that non-melt laser beam 168 is incident wafer surface 12 at a near normal incident angle $\theta_1$ or at a large oblique incident angle $\theta_1$. In an example embodiment, first optical axis A1 has an angle $\theta_1$ that is substantially equal to the Brewster's angle for wafer surface 12, so that aforementioned pattern density effects from non-uniform optical absorptions are reduced or minimized.

Non-melt optical system 166 is configured to receive an initial non-melt laser beam 162 and form therefrom non-melt laser beam 168. Non-melt laser beam 168 travels generally along first (non-melt) optical axis A1 and forms a first (non-melt) line image 170 at wafer surface 12.

Figure 4A:
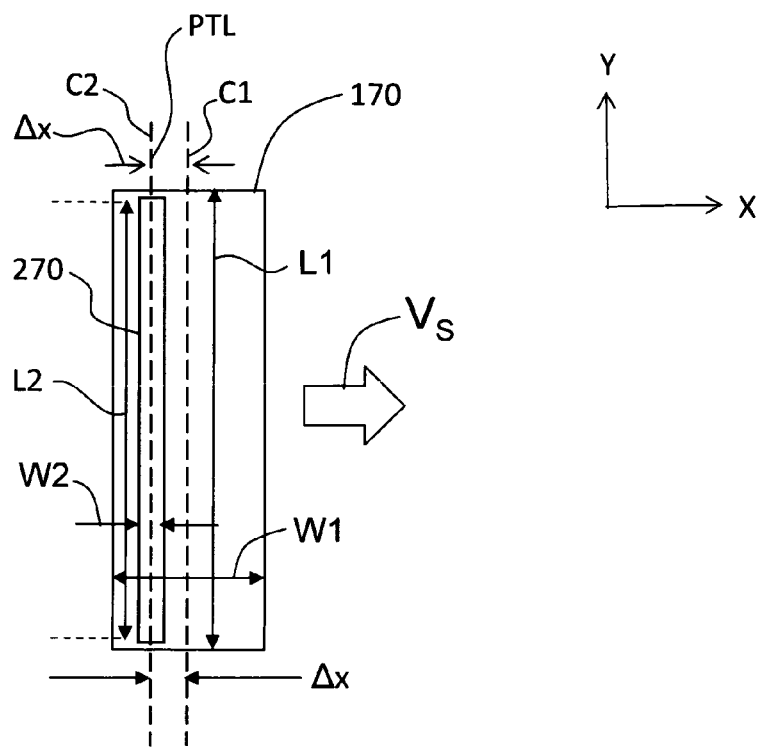
FIG. 4A is a plan schematic view of idealized melt and non-melt line images as formed on the wafer surface, illustrating an example configuration for the line images.
Figure 4B:
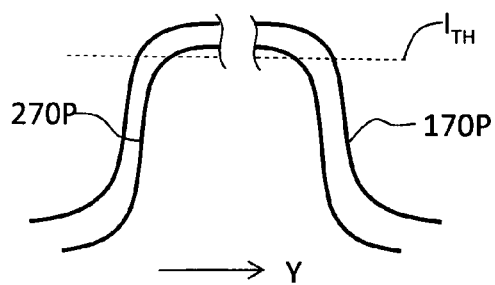
FIG. 4B and FIG. 4C are cross-sectional views of example melt and non-melt line images as taken along their respective lengths (FIG. 4B) and along their respective widths (FIG. 4C)
Figure 4C:
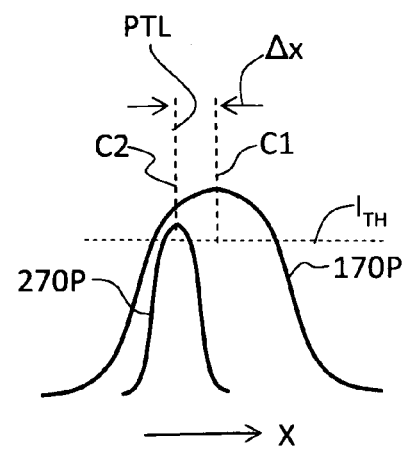

FIG. 4A is a plan schematic view of an example idealized non-melt line image 170 as formed on wafer surface 12. FIG. 4B and FIG. 4C are schematic plots of an example intensity profile 170P for non-melt line image 170 as taken in the Y-direction (FIG. 4B) and X-direction (FIG. 4C). The intensity profile 170P corresponds to that of non-melt laser beam 168 at wafer surface 12 and defines non-melt line image 170, e.g., by the intensity being above a certain threshold intensity $I_{TH}$. Non-melt line image 170 is shown as having a centerline or axis C1 in the long (i.e., Y) direction, which is perpendicular to the scan (i.e., X) direction. Non-melt line image 170 is scanned in the x-direction at a velocity $V_S$ as indicated by the large arrow in FIG. 4A.

A typical non-melt laser beam 168 has a Gaussian intensity profile in the scanning direction, and a relatively flat top profile in the long (cross-scanning) direction. An example beam width W1 (defined at full width half maximum (FWHM) of the Gaussian profile) for non-melt laser beam 168 (and thus for non-melt line image 170) is in the range from about 0.05 mm to about 2 mm. An example beam length L1 for non-melt laser beam 168 (and thus for non-melt line image 170) is typically in the range from about 5 mm to about 20 mm. In an example, the scanning of non-melt laser beam 168 and its corresponding non-melt line image 170 has an associated heat diffusion length (depth) into wafer 10 in the range from about 30 microns to about 500 microns.

With reference again to FIG. 3, system 100 also includes a second laser system 250 configured to generate at least one second laser beam 268. The at least one second laser beam 268 is used to add heat to the pre-heated portion of wafer surface 10 as caused by irradiation with non-melt laser beam 168 (and optionally heated chuck 130) so that the wafer surface temperature $T_S$ locally rises up to the wafer melt temperature $T_{melt}$, thereby causing the wafer surface 12 to locally melt. Accordingly, second laser system 250 is hereafter referred to as the melt laser system 250 and the at least one second laser beam 268 is referred to as the at least one melt laser beam 268.

In an example, melt laser system 250 includes a melt laser 260 that generates an initial melt laser beam 262 that includes a series of melt light pulses 262P. Melt laser system 250 also includes a melt optical system 266 operably arranged relative to melt laser 260 along a second (melt) optical axis A2. An example melt optical system 266 includes a beam-shaping optical system 266A, a fold-mirror FM, an adjustable aperture 267 and a projection optical system 266B. Melt optical system 266 is configured to receive initial melt pulsed laser beam 262 from melt laser 260 and form therefrom melt laser beam 268 (with light pulses 268P). Melt laser beam 268 forms at wafer surface 12 a second (melt) line image 270 relative to the non-melt line image 170 so that that the aforementioned local wafer surface melting occurs. In an example embodiment, second (melt) optical axis A2 is substantially at a normal incident angle $\theta_2$ to wafer surface 12 as shown in FIG. 3, though any reasonable incident angle for second optical axis A2 can be employed (see FIG. 6A for incident angle $\theta_2$)

FIG. 4A also includes a plan schematic view of an example idealized melt line image 270 as formed on wafer surface 12 relative to non-melt line image 170. FIG. 4B and FIG. 4C also include X-direction and Y-direction cross-sectional plots of an example intensity profile 270P for melt laser beam 268, which intensity profile defines melt line image 270, e.g., by the intensity being above a threshold intensity $I_{TH}$. Melt line image 270 has a length L2 in the Y-direction and a width W2 in the X-direction.

Figure 4D:
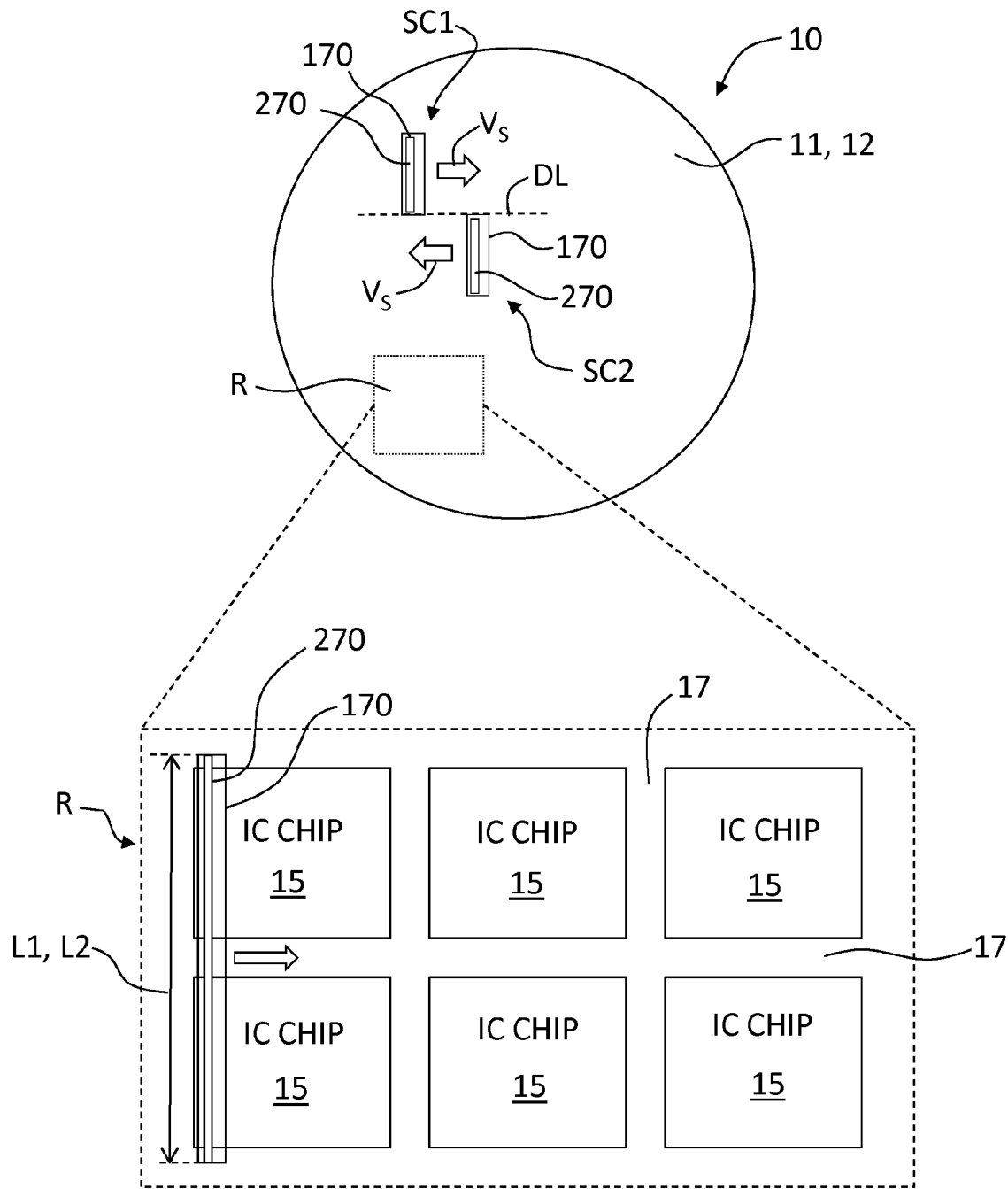
FIG. 4D is a plan view of an example wafer, along with a close-up inset illustrating an example region R wafer surface that includes an array of IC chips and showing example melt and non-melt line images, which are sized to accommodate the size of the IC chips so that stitching between scans occurs within the gaps between the IC chips.

FIG. 4D is a plan view of an example wafer 10 that includes a close-up inset illustrating an example region R wafer surface 12. Region R includes a number of IC chips 15 spaced apart by gaps 17, e.g., a kerf region or a region used to form scribe lines for dicing the IC chips. In an example, length L2 of melt line image 270 can be the same as or multiple times the size of the particular integrated circuit (IC) chips 15 being laser annealed so that the stitching between adjacent scans SC1 and SC2 of the non-melt and melt line images 170 and 270 occurs within gaps 17. The dashed line DL in FIG. 4D indicates where adjacent scans SC1 and SC2 are stitched.

In an example, at least one of the non-melt line image length L1 and the melt line image length lengths L2 can be selected to confine the melt process to a select region R on wafer surface 12 besides that defined by IC chips 15. Selective melting in the scanning direction can be achieved by controlling the timing of melt light pulses 268P. It is noted here that IC chips 15 means chips that are in the process of being fabricated and not necessarily finalized IC chips. In other words, IC chips 15 include IC chip features that are formed along the way in forming complete IC chips.

Intensity profile 270P as taken along the scanning direction can be either substantially flat-top or curved, e.g., having a Gaussian form. In an example, the width W2 of melt line image 270 is defined by the FWHM of a Gaussian Y-direction cross-section of the intensity profile 270P. A typical width W2 for a flat top melt laser is in the range of 10 microns to 500 microns. In an example, length L2 of melt line image 270 is substantially the same as the length L1 of the non-melt line image 170. A flat top intensity profile 270P for melt line image 270 generally provides better power efficiency.

Figure 5:
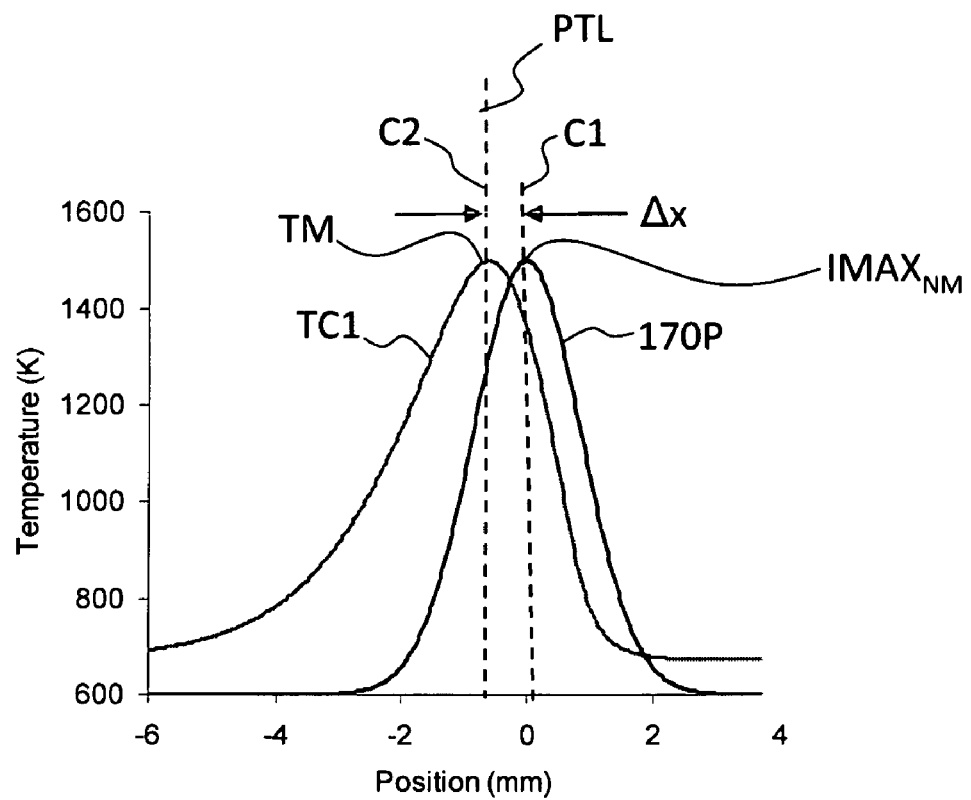
FIG. 5 plots the temperature T(K) versus position (mm) for a temperature curve TC1 of the wafer surface temperature profile associated with scanning the non-melt laser beam, and also shows in proper spatial relation the corresponding non-melt line image intensity profile (170P) for the non-melt line image that scans over the wafer surface.

FIG. 5 plots the temperature T(K) versus position (mm) and shows a temperature curve TC1 of an example wafer surface temperature profile created by scanning non-melt laser beam 168 and its corresponding line image 170 over wafer surface 12. The non-melt laser beam intensity profile 170P is overlaid on the plot in the proper relative spatial relationship. The plot shows a positional difference Δx between the position of the maximum intensity $IMAX_{NM}$ of non-melt laser beam intensity profile 170P and the position of the maximum surface temperature $T_{SM}$ denoted by peak temperature line or axis PTL. This positional difference Δx is called the positional lag, and it is assumed here that the scan direction is the X-direction.

In an example that generally results in good wafer surface temperature uniformity, the centerline or axis C2 of the melt line image 270 substantially resides along the peak temperature line (axis) PTL associated with the non-melt heating, as is illustrated in FIG. 5. Depending on stage velocity $V_S$ and the width W1 of non-melt laser beam 170, the positional lag Δx can range from a few microns to several hundreds of microns in the scanning direction.

Figure 1:
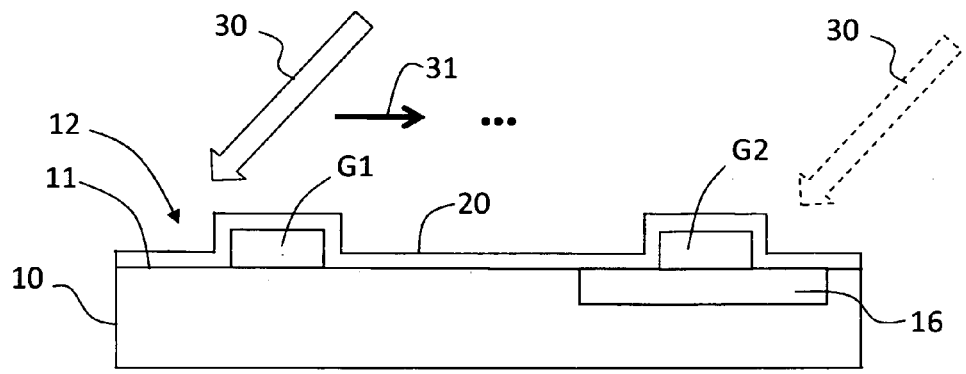
FIG. 1 is a schematic cross-sectional view of an example silicon wafer in the process of forming an IC chip, wherein conventional melt laser annealing is used to anneal the wafer.
Figure 6A:
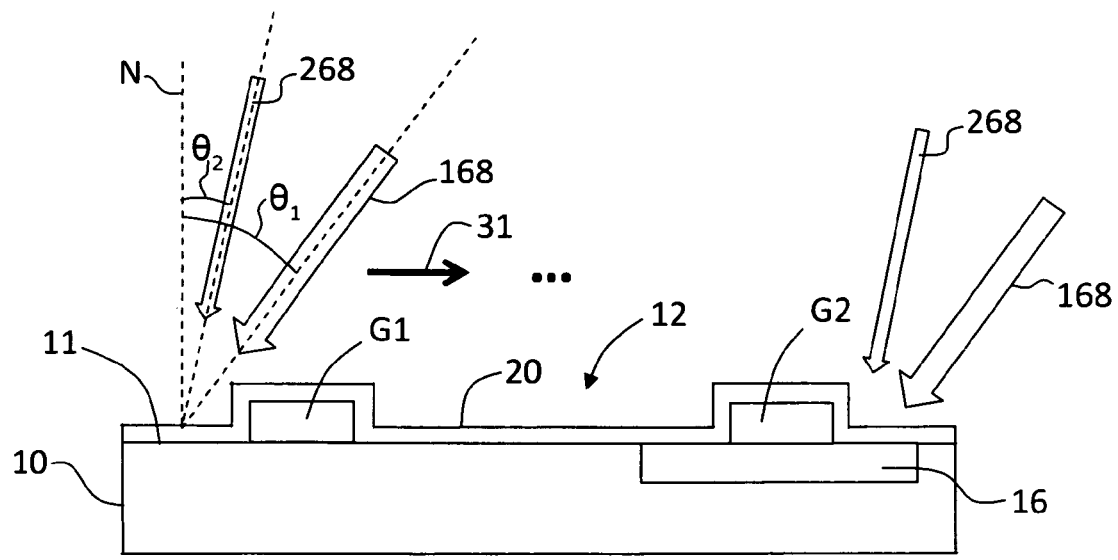
FIGS. 6A through 6D are similar to FIG. 1 but show the ultrafast laser annealing process according to the disclosure as carried out with a single non-melt laser beam and a single melt laser beam (FIG. 6A), with two non-melt laser beams and a single melt laser beam (FIG. 6B), with an anti-reflectance layer (FIG. 6C), and without any intervening medium (FIG. 6D)

FIG. 6A is similar to FIG. 1, but illustrates an example wherein the ultrafast laser annealing process is carried out using a single non-melt laser beam 168 and a single melt laser beam 268. The normal line to wafer surface 12 is indicated by dashed line N. The incident angle $\theta_2$ of melt laser beam 268 can be near normal (as shown) or oblique. If near normal (i.e., <30 degrees from normal) is used, a circularly polarized melt laser 260 can be used to reduce or minimize the aforementioned pattern density effects. In the manufacturing of certain types of advanced integrated circuits, the patterned line features are generally much smaller than the laser wavelength and their orientations are unidirectional. In this case, a p-polarized melt laser beam 268 can be used at a relatively large incident angle $\theta_2$, e.g., in the range from about 50 degrees to about 75 degrees, with the incidence plane being perpendicular to the patterned lines. In an example, the incident angle $\theta_1$ for non-melt laser beam 168 can be generally anywhere from 0 degrees (normal incident) to close to 90 degrees, with the aforementioned Brewster's angle being a good choice.

Figure 6B:
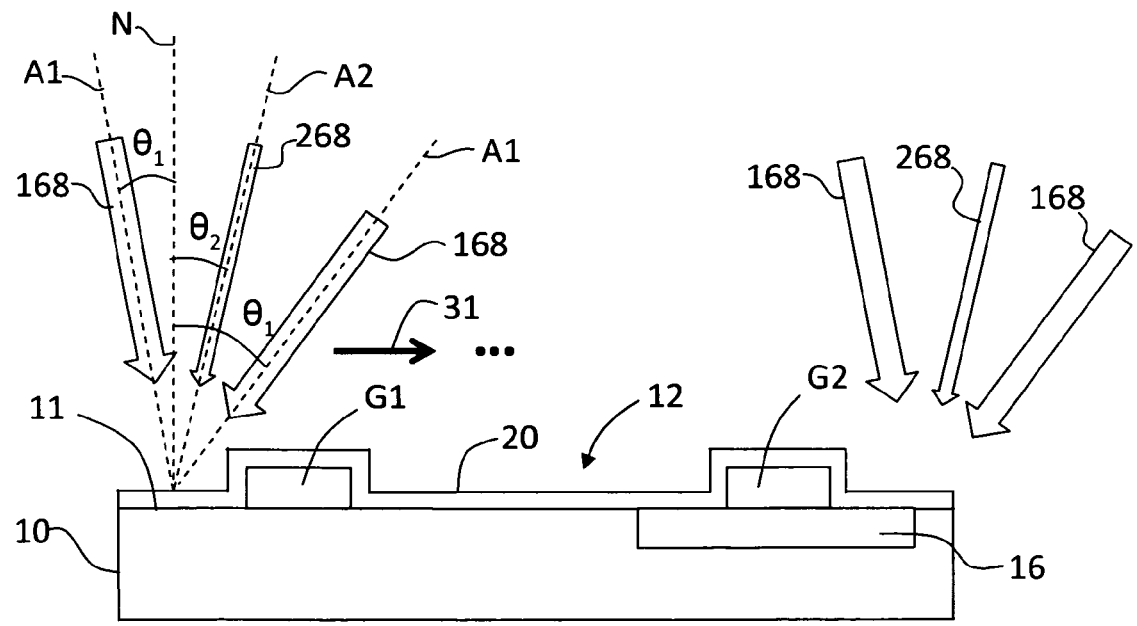

FIG. 6B is similar to FIG. 6A and illustrates an example ultrafast annealing method that utilizes two non-melt laser beams 168. In this case, one non-melt laser beam 168 can be used to heat the wafer surface 12 to an intermediate temperature and the other non-melt laser beam can bring the surface temperature up closer to the wafer melt temperature $T_{melt}$. This approach provides extra flexibility in tuning the ultrafast annealing process.

Figure 6C:
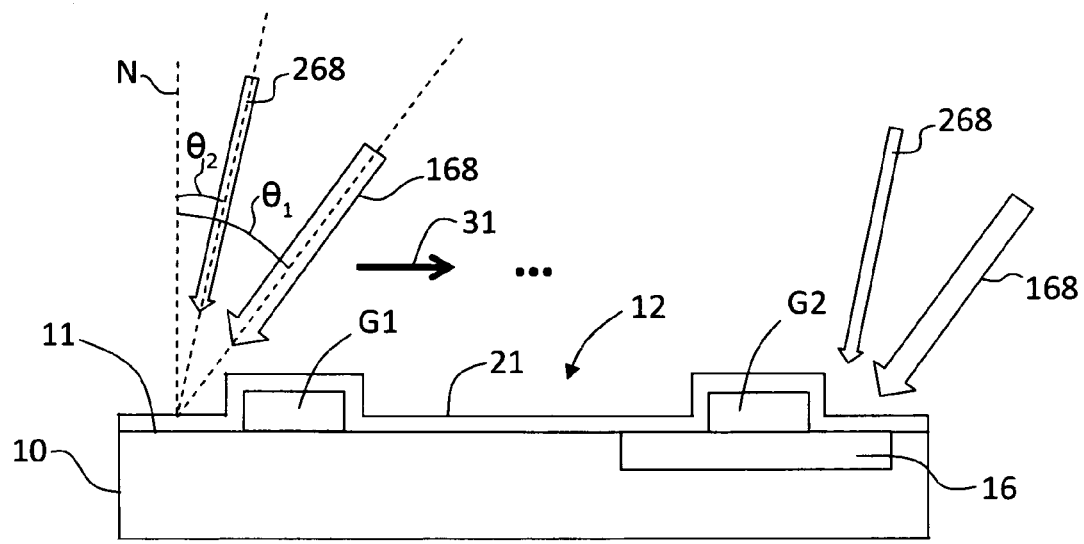

To improve light-coupling efficiency and to further reduce the pattern density effects associated with melt laser 260, FIG. 6C illustrates an example embodiment wherein a dielectric anti-reflection layer 21 deposited atop wafer surface 12 is used to enhance the absorption of output melt laser beam 268 at bare silicon regions while preventing overheating at shallow trench isolation region.

Figure 6D:
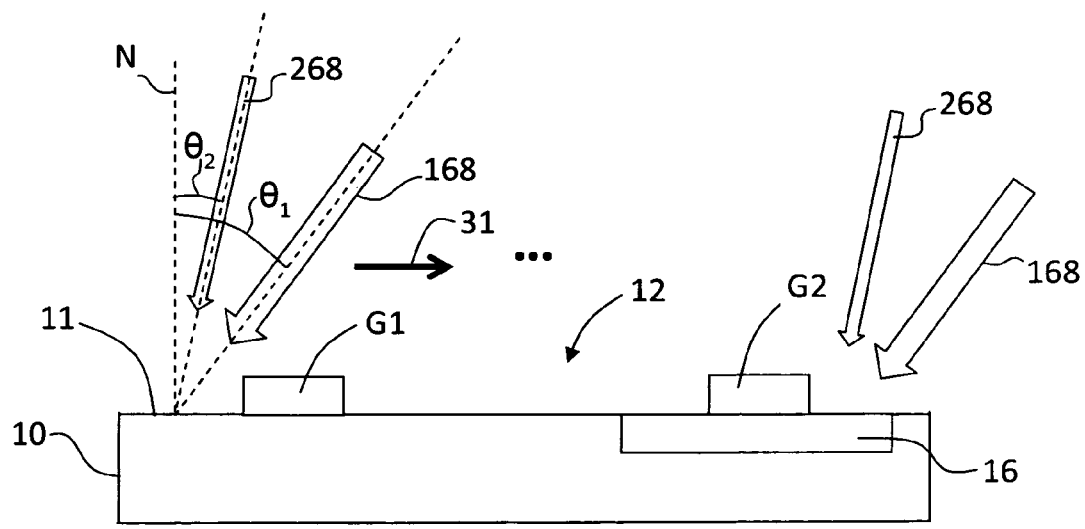

The ultrafast laser annealing systems and methods disclosed herein can also be used in conjunction with other existing techniques used to mitigate pattern density effects. The existing techniques include for example the use of an absorber capping layer 20 (either partial transparent or opaque; see FIGS. 6A and 6B)) or anti-reflectance layer (FIG. 6C) to further improve the heating uniformity (see FIGS. 6A and 6B). Alternatively, ultrafast laser annealing systems and methods disclosed herein can be applied directly to wafer surface 12, as shown in FIG. 6D without any additional techniques or intervening medium.

The choice of wavelength for melt laser 260 depends on the particular laser annealing application. For ultra-shallow junction formation for advanced transistor fabrication, the melt depth is typically in the range of a few nanometers to several tens of nanometers. A short-wavelength melt laser 260 with a high optical absorption coefficient may thus be used to limit the penetration depth into wafer 10. Examples lasers for melt laser 260 include an excimer laser (e.g., a 308 nm XeCl excimer laser) and a diode pumped 532 nm. For laser annealing applications that require relatively deep melts, an IR laser with a substantial optical penetration depth can be used as the melt laser 260, such as a 1064 nm Nd:YAG laser or a $CO_2$ laser.

In an example, the repetition rate of melt laser 260 is larger than the stage scanning velocity divided by the scan-direction width W1 of the melt laser line image 270. This ensures that each point on wafer surface 12 that is scanned receives at least one melt light pulse 268P from melt laser 260 (i.e., adjacent melt line images 270 at least just touch one another). An example repetition rate for melt laser 260 is 1 kHz or greater, and in another example is in the range of 1 kHz to 100 kHz. In an example, the temporal width $\Delta t_M$ of the pulses 268P in melt laser beam 268 is in the range from about 5 ns to about 1 µs (see FIG. 3). Example velocities for wafer stage 120 range from 10 mm/s to 1000 mm/s, and a typical width W2 for melt line image 270 is about 100 microns. In an example, melt laser 260 generates a melt laser beam 268 having an amount of power between 20 W and 500 W.

With reference again to FIG. 3, system 100 also optionally includes a pyrometer 280 that detects a wafer surface temperature and generates in response a temperature signal ST representative of the measured wafer surface temperature $T_S$.

System 100 further includes a system controller 300 electrically connected to stage controller 124, chuck controller 134, non-melt laser 160, melt laser 260, adjustable aperture 267, and pyrometer 280. In an example, system controller 300 comprises a computer or like machine, that is adapted (e.g., via instructions such as software embodied in a computer-readable or machine-readable medium) to cause the controller to control the operation of the various components of system 100. System controller 300 includes a processor unit ("processor") 302 and a memory unit ("memory") 304. An example controller 300 is or includes a computer with a processor and includes an operating system such as Microsoft WINDOWS or LINUX.

In an example embodiment, processor 302 is or includes any processor or device capable of executing a series of software instructions and includes, without limitation, a general- or special-purpose microprocessor, finite state machine, controller, computer, central-processing unit (CPU), field-programmable gate array (FPGA), or digital signal processor. In an example embodiment, the processor is an Intel XEON or PENTIUM processor, or an AMD TURION or other in the line of such processors made by AMD Corp., Intel Corp. or other semiconductor processor manufacturer.

Memory 304 is operably connected to processor 302. As used herein, the term "memory" refers to any processor-readable medium, including but not limited to RAM, ROM, EPROM, PROM, EEPROM, disk, floppy disk, hard disk, CD-ROM, DVD, or the like, on which may be stored a series of instructions executable by processor 302. In an example embodiment, controller 300 includes a disk drive 306 adapted to accommodate a removable processor-readable medium 308, such as CD-ROM, DVE, memory stick or like storage medium.

The ultrafast laser annealing methods described herein may be implemented in various embodiments in a machine-readable medium (e.g., memory 302) comprising machine readable instructions (e.g., computer programs and/or software modules) for causing controller 300 to perform the annealing methods described herein by controlling the operation of system 100. In an example embodiment, the computer programs run on processor 302 out of memory 304.

The computer programs and/or software modules may comprise multiple modules or objects to perform the various methods of the present invention, and control the operation and function of the various components in system 100. The type of computer programming languages used for the code may vary between procedural code-type languages to object-oriented languages. The files or objects need not have a one-to-one correspondence to the modules or method steps described. Further, the method and apparatus may comprise combinations of software, hardware and firmware. Firmware can be downloaded into processor 302 for implementing the various example embodiments disclosed herein.

System Operation

In an example of the operation of system 100, system controller 300 sends a first control signal S1 to non-melt laser 160, which in response thereto generates initial non-melt laser beam 162. This initial non-melt laser beam 162 is received by non-melt optical system 166, which forms therefrom non-melt laser beam 168, which travels generally along first optical axis A1 and forms non-melt line image 170 at wafer surface 12.

System controller 300 also sends as second control signal S2 to melt laser 260, which in response thereto generates initial melt laser beam 262. This initial melt laser beam 262 is received by melt optical system 266, which forms therefrom output melt pulsed laser beam 268 that forms melt line image 270 relative to the non-melt line image 170 so that that the aforementioned local wafer surface melting occurs.

System controller 300 also sends a third control signals S3 to stage controller 124 to move (scan) wafer 10 relative to non-melt and melt line images 170 and 270. In an example where chuck 130 provides wafer pre-heating, system controller 300 may also send a control signal S4 to chuck controller 134 to initiate the wafer pre-heating process. In an example, system controller 300 also receives temperature signal ST from pyrometer 280 and uses this temperature signal to control the intensity of one or both of non-melt laser beam 168 and melt laser beam 268. System controller 300 also sends a fifth control signal S5 to adjustable aperture 267 to optionally set the length L2 and width W2 of melt line image 270.

The dwell time $t_D$ of non-melt line image 170 is given by the ratio of line-image width W1 to scanning velocity $V_S$. In an example, the dwell time $t_D$ is in the range of 100 microseconds (μs)≦$t_D$≦20 millisecond (ms). To ensure uniform preheating with non-melt line image 170, in an example the travel distance between two successive melt pulses 268P is smaller than the substantially uniform temperature region heated by non-melt laser beam 168

Figure 7:
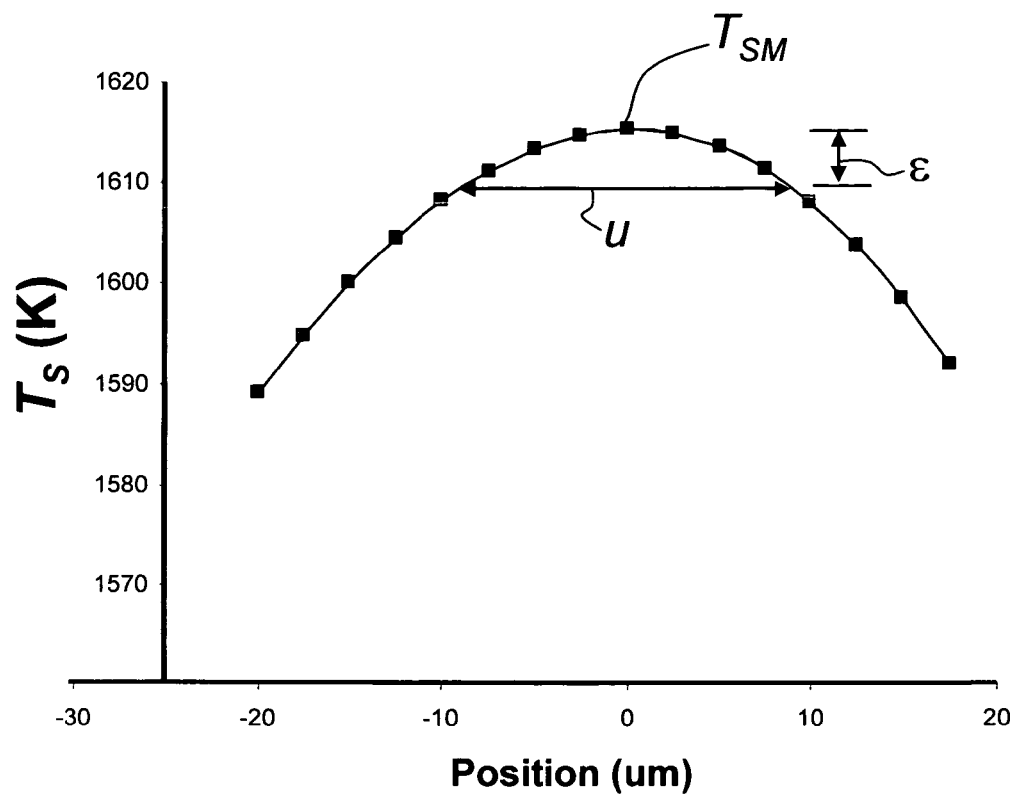
FIG. 7 is a plot of temperature T(K) as a function of position (microns) on the wafer surface, and shows a typical wafer surface temperature profile from the non-melt laser along the scanning direction.

FIG. 7 is a plot of the wafer surface temperature $T_S(K)$ as a function of position on wafer surface 12 and shows a typical wafer surface temperature profile associated with scanning non-melt laser beam 168 along the scanning direction. The substantially uniform portion of the non-melt heating is denoted u and is the region near the maximum surface temperature $T_{SM}$ where the temperature roll-off is less than a predefined non-uniformity tolerance ∈. As an example, for ∈=10° C., u is roughly ~20% of the non-melt laser beam width W1.

Figure 8A:
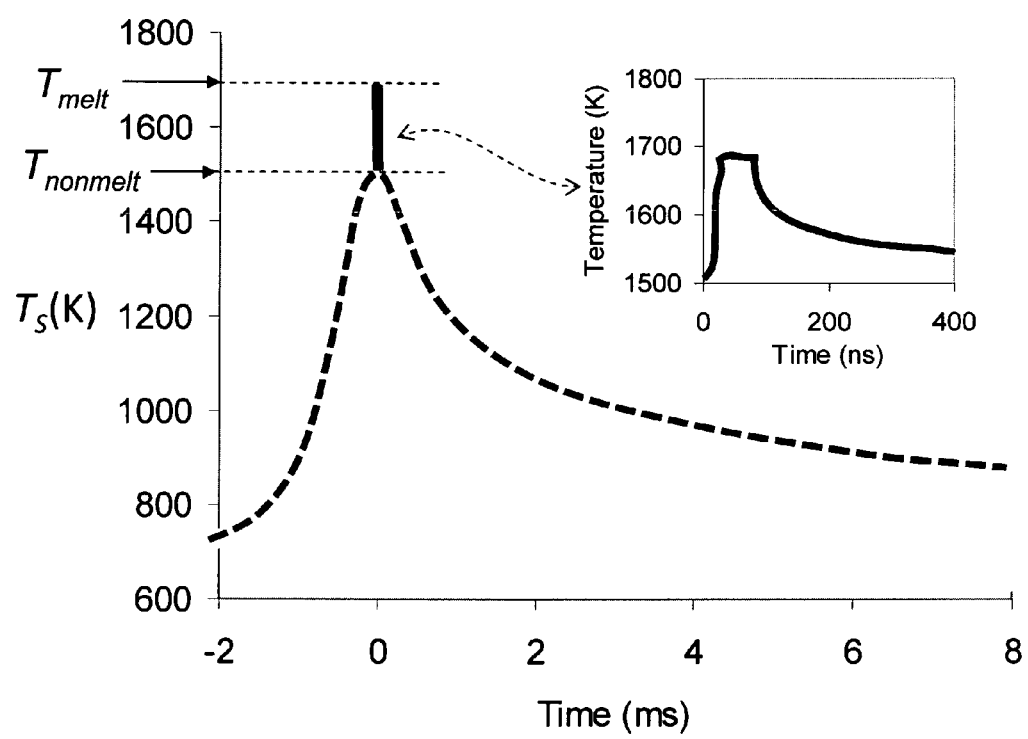
FIG. 8A and FIG. 8B are plots of temperature T(K) versus time (ms) and temperature T(K) versus depth, respectively, the plots illustrating simulated temporal and depth wafer surface temperature profiles at a point on the wafer surface associated with an example ultrafast laser annealing method carried out with a single non-melt laser beam and a single melt laser beam, such as illustrated in FIG. 6A.
Figure 8B:
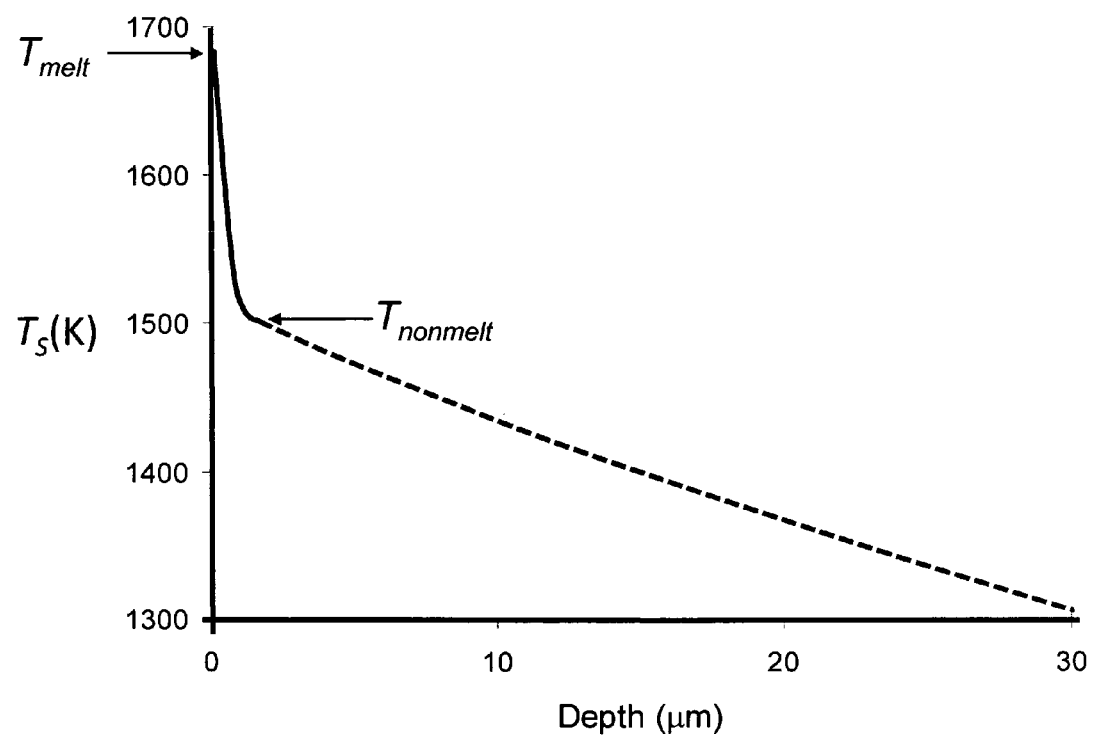

FIG. 8A and FIG. 8B are plots of the wafer surface temperature $T_S(K)$ versus time (ms), and temperature $T_S(K)$ versus depth, respectively. In FIG. 8A, the non-melt portion of the temperature profile is shown as a dashed line that peaks at the non-melt temperature maximum $T_{nonmelt}$. In FIG. 8B, the melt part of the curve is shown as a solid line and the non-melt part of the curve is a shown as a dashed line.

The two plots of FIG. 8A and FIG. 8B illustrate simulated temporal and depth wafer surface temperature profiles at a point on wafer surface 12 subjected to an example of the ultrafast laser anneal method disclosed herein. In the example, the non-melt laser 160 was a $CO_2$ laser and had a dwell time $t_p$ of 0.8 ms. The maximum wafer surface temperature $T_{SM}$ generated by scanning the non-melt line image 170 over wafer surface 12 was $T_{SM}$=1500K (1227° C.). Melt laser 260 generated melt light pulses 268P having a pulse duration $\Delta t_M$ of 30 ns, with the melt laser beam 268 having a fluence of 75 mJ/cm2 and a wavelength of 532 nm. The inset of FIG. 8A shows in more detail the melt temperature profile associated with melt laser beam 268, which temperature profile is shown in the main plot as a temperature spike that peaks at about 1685K (i.e., about 1412° C.).

Figure 9:
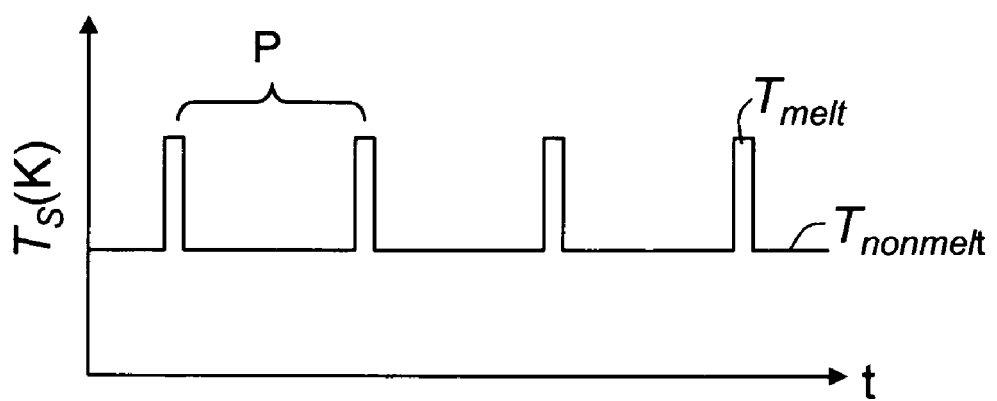
FIG. 9 illustrates an example idealized wafer surface temperature profile associated with the ultrafast laser annealing method disclosed herein.
Figure 10:
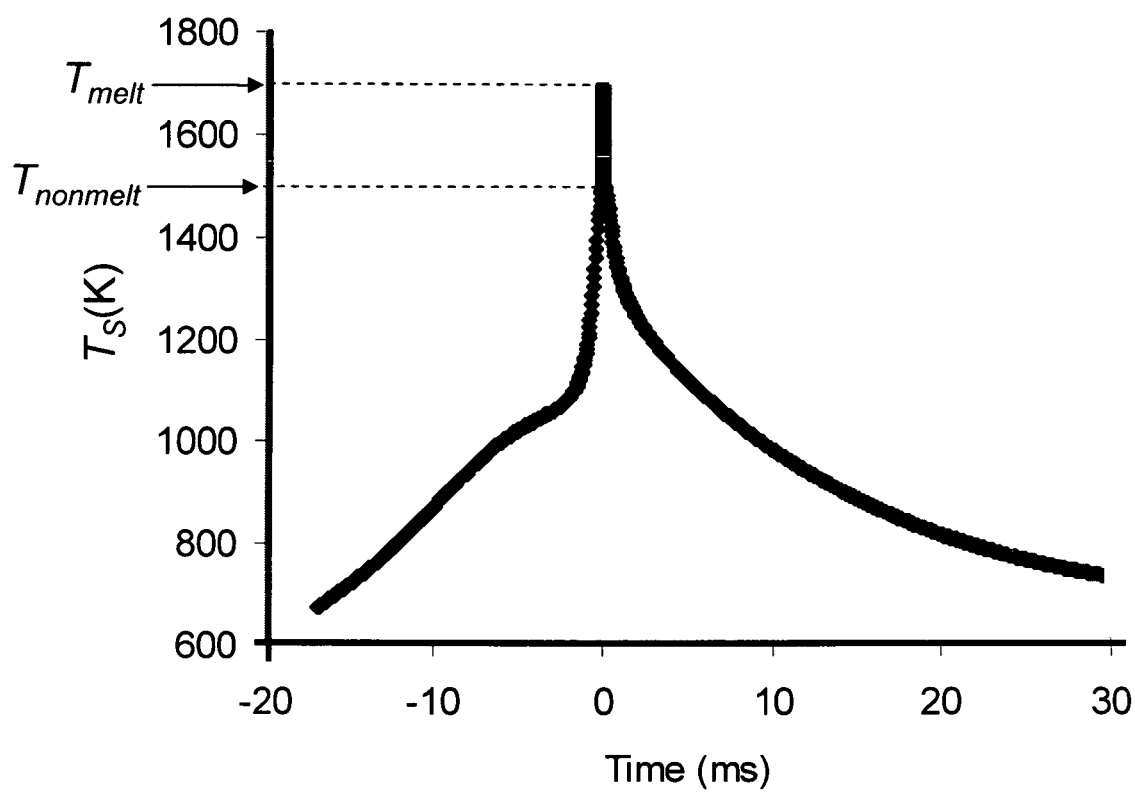
FIG. 10 plots the wafer surface temperature $T_S(K)$ versus time (ms) and illustrates an example time evolution of the wafer surface temperature for the laser annealing method that uses two non-melt laser beams and a single melt laser beam system, such as illustrated in FIG. 6B.

FIG. 9 plots an example wafer surface temperature $T_S(K)$ as a function of time t (arbitrary units) and illustrates an example idealized wafer surface temperature profile for an example of the ultrafast laser annealing method such as illustrated in FIG. 6A. FIG. 10 plots the wafer surface temperature $T_S(K)$ versus time (ms) and illustrates the time evolution of the annealing temperature $T_S$ at wafer surface 12 using a dual non-melt laser beam configuration. The non-melt preheat temperature of wafer 10 is held constant by monitoring the thermal emission from the heated spot on the wafer surface 12 using pyrometer 280 and feeding back temperature signal ST to system controller 300. The data sampling for the non-melt feedback control occurs between the $T_{melt}$ peaks (see FIG. 9) caused by melt laser pulses 268P so that the thermal emission from melt heating will not interfere with the control of non-melt laser beams 168. The period P between the $T_{melt}$ peaks is the inverse of the repetition rate of melt laser pulses 268P.

Improved Surface Temperature Uniformity

A benefit of using the ultrafast laser annealing systems and methods disclosed herein is improved temperature uniformity of the wafer surface 12 by mitigating the aforementioned adverse pattern density effects. To the first order, the temperature variation (i.e., non-uniformity) $\Delta T$ associated with performing the laser annealing process can be estimated by the following equation:

$$\Delta T = \left(\frac{T_{melt} - T_{nonmelt}}{T_{melt} - T_{sub}}\right) \cdot \Delta T_{melt} + \Delta T_{nonmelt}$$

where $\Delta T_{melt}$ is the temperature variation due to pattern density effects from conventional melt anneal without non-melt preheating, $\Delta T_{nonmelt}$ is the temperature variation due to pattern density effects from non-melt annealing, $T_{sub}$ is an initial wafer surface temperature (which may be elevated by the use of heated chuck 130), $T_{nonmelt}$ and $T_{melt}$ are the peak annealing temperatures from the non-melt laser beam 168 and the melt laser beam 268, respectively.

Typically, $\Delta T_{nonmelt}$ is much smaller than $\Delta T_{melt}$ due to an orders-of-magnitude difference in the heat diffusion length, and the use of a long-wavelength non-melt laser 160 such as a $CO_2$ laser (e.g., 10.6 microns) operating at Brewster's angle of incidence $\theta_1$. The former reduces pattern density effects from inhomogeneous thermal properties while the latter reduces pattern density effects based from optical absorption non-uniformity. As a result, the above expression for $\Delta T$ becomes:

$$\Delta T \approx \left(\frac{T_{melt} - T_{nonmelt}}{T_{melt} - T_{sub}}\right) \cdot \Delta T_{melt}$$

As the non-melt temperature $T_{nonmelt}$ is raised closer to the melt temperature $T_{melt}$, the overall pattern density effects can be reduced dramatically. In practice, the maximum non-melt temperature $T_{nonmelt}$ is limited by the particular semiconductor process, such as slip generation or gate oxide defects. For a silicon substrate 10, $T_{melt}$=1412° C. and $T_{nonmelt}$ can range from 1000 to 1350° C. Assuming $T_{sub}$=400° C. is used, then:

$\Delta T/\Delta T_{melt} \approx 6\% \sim 40\%$.

Using the above formula, the minimum non-melt temperature $T_{nonmelt}$ required to obtain an acceptable temperature variation (non-uniformity) $\Delta T$ for a particular semiconductor process can be calculated. For example, if the required temperature uniformity is 20° C. or less (i.e., $\Delta T<20°$ C.) and if $\Delta T_{melt}$=100° C., $T_{sub}$=400° C. and $T_{melt}$=1412° C., then:

$\Delta T<20°$ C.=[(1412° C.−$T_{nonmelt}$)/(1012° C.)](100° C.)

Solving for $T_{nonmelt}$ yields:

$T_{nonmelt}$>1412° C.−((20° C./100° C.)*1012° C.)=1210° C.

This indicates that 1210° C. is the minimum non-melt temperature $T_{nonmelt}$ required to achieve the desired goal of 20° C. non-uniformity. Higher non-melt temperatures $T_{nonmelt}$ will reduce the total temperature non-uniformity $\Delta T$.

Figure 2:
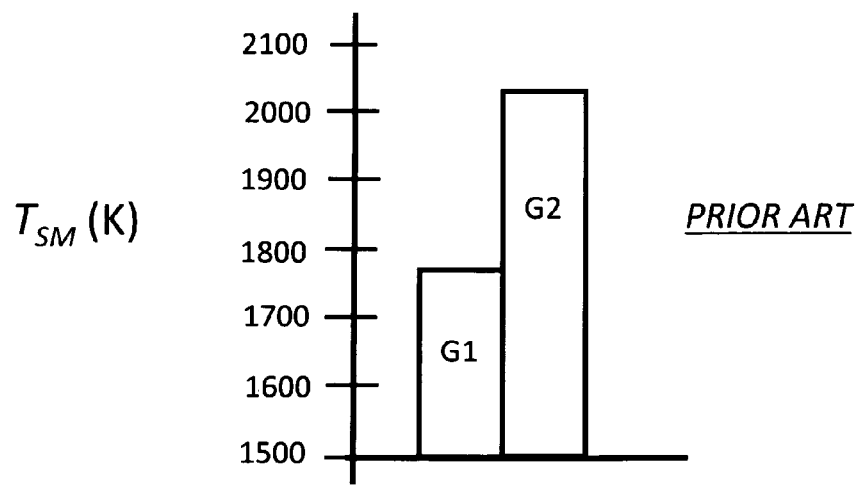
FIG. 2 is a bar-graph plot of the maximum surface temperature $T_{SM}(K)$ for the first and second poly gates G1 and G2 of the silicon wafer of FIG. 1, illustrating how pattern density effects cause the second poly gate G2 to be substantially overheated as compared to the first poly gate G1 when using conventional melt laser annealing.
Figure 11:
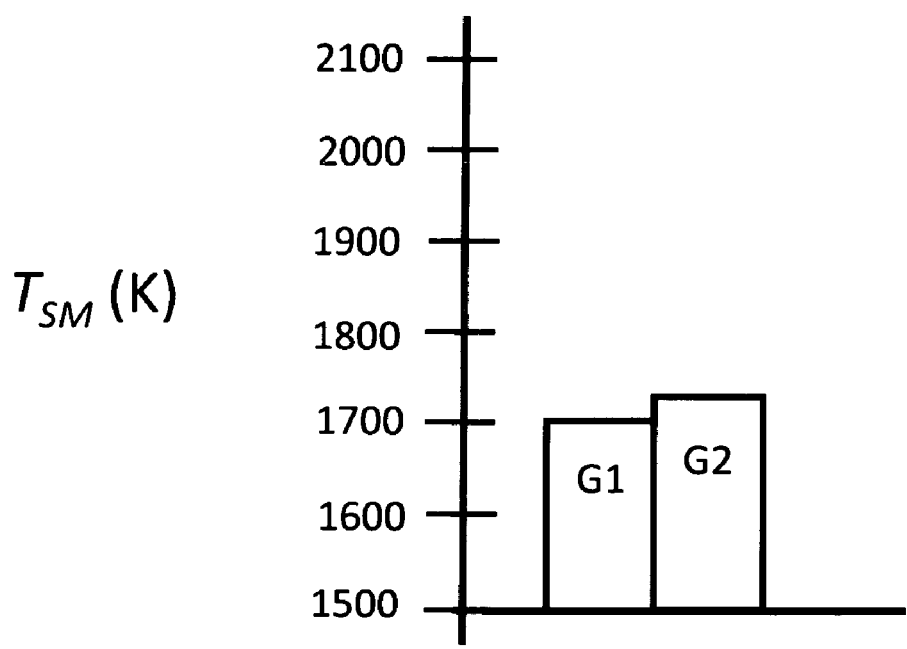
FIG. 11 is a bar-graph plot similar to FIG. 2, and illustrates how the ultrafast laser annealing systems and methods disclosed herein mitigate pattern density effects by leading to a much smaller temperature difference between the two poly gates G1 and G2 as compared to conventional melt laser annealing (see FIG. 2)

FIG. 11 is similar to FIG. 2, and illustrates how the laser annealing systems and methods disclosed herein can mitigate pattern density effects to reduce the temperature difference between the two gates G1 and G2 as compared to the conventional melt laser annealing approach (see FIG. 2).

By employing non-melt laser preheating with non-melt laser beam 168, the fluence requirement on melt laser 260 can be lowered significantly as compared to that for conventional melt laser annealing. For example, for the example where a 1500K non-melt preheating is provided by non-melt laser beam 168, it is estimated that the fluence requirement for melt laser 260 and associated melt laser beam 268 is about 17% that of the conventional melt laser annealing process.

Figure 12:
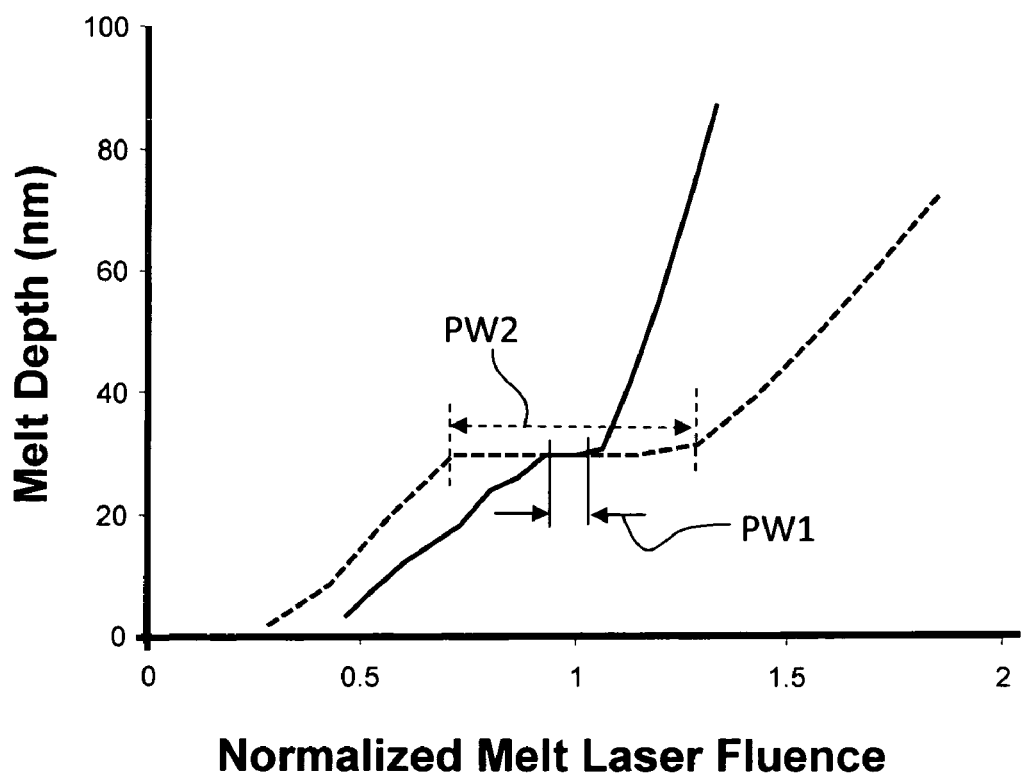
FIG. 12 plots the melt depth (nm) vs. normalized laser fluence for the ultrafast laser annealing method disclosed herein as applied to a silicon wafer having 30 nm amorphized junctions, illustrating the larger process window PW2 (dashed-line arrow) for the ultrafast laser annealing versus the conventional melt laser annealing process window PW1 (solid arrows) for the conventional melt laser annealing.

The laser annealing systems and methods disclosed herein can also improve the laser annealing process window as compared to conventional melt laser annealing systems and methods. FIG. 12 plots the melt depth (nm) vs. normalized laser fluence for a silicon wafer having 30 nm amorphized junctions for conventional laser melt annealing (solid line) having an associated process window PW1 and the ultrafast laser annealing disclosed herein (dashed line) and having an associated process window PW2.

The amorphization is introduced to lower the melting temperature of wafer 10. This allows the melt depth to stay constant within a certain range of fluence (as defined as the process window) when the junction temperature is higher than amorphized silicon but lower than crystalline silicon. A dramatic improvement in the process window PW2 is observed with $T_{nonmelt}$ at 1300K (dashed line and dashed arrow) as compared to process window PW1 associated with the conventional melt laser annealing (solid line and solid arrows). Note that for this application, $T_{nonmelt}$ and the non-melt dwell time should be optimized so that the thermal budget does not fully crystallize the amorphous silicon before reaching the melt temperature $T_{melt}$.

Another benefit of the laser annealing systems and methods disclosed herein is the improved curing of defects and the precise dopant diffusion tuning as compared to conventional melt laser annealing systems and methods. The conventional melt laser annealing process cannot recover implant damage outside the melt region due to its extremely low thermal budget. This could result in a high junction leakage current. The ultrafast laser annealing system and methods disclosed herein, on the other hand, provide a greater thermal budget and have been demonstrated to improve the junction leakage current at long non-melt dwell times $t_r$, (e.g., several to a few tens of milliseconds). For optimal transistor performance, it is also desirable to have the flexibility to tune the dopant profile even slightly (e.g., by a few nanometers). While this is difficult to achieve with conventional melt laser annealing, it can be achieved using the laser annealing systems and methods disclosed herein by changing at least one of the non-melt dwell time and non-melt pre-heat temperature.

Figure 13:
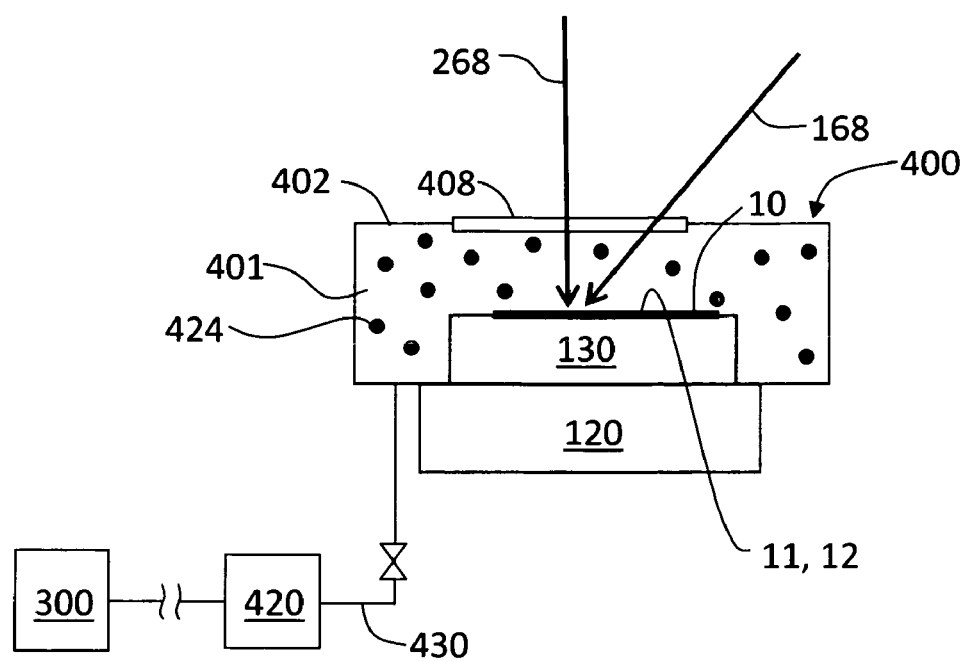
FIG. 13 is a schematic side view of a portion of the ultrafast laser annealing system of FIG. 1, illustrating an example embodiment where the system is configured to perform ultrafast laser annealing in conjunction with gas immersion laser doping.

FIG. 13 is a schematic side view of a portion of system 100 similar to that of FIG. 1 and illustrating an example embodiment where system 100 is configured to performed ultrafast laser annealing in conjunction with gas immersion laser doping. In FIG. 13, wafer 10 is enclosed within an interior 401 of a chamber 400. Chamber 400 includes a top side 402 that includes a window 408 that is substantially transparent to the wavelengths of light used in non-melt laser beam 168 and melt laser beam 268. System 100 includes a gas source 420 that provides a gaseous dopant precursor 424 via a gas line 430 to chamber interior 401 and thus adjacent wafer surface 12. Chamber interior 401 is thus configured to operably support gaseous dopant precursor 424 adjacent wafer surface 12.

In an example, controller 300 is operably connected to gas source 420 and controls its operation in coordination with the other laser annealing operations described above. In this embodiment, the laser energy within the chamber serves to dissociate gaseous dopant precursor 424 as well as to heat wafer surface 12. This allows the dopants from the gaseous dopant precursor 24 to diffuse into wafer surface 12 during the laser annealing process. Example gaseous dopant precursors 424 include $AsH_3$ to provide for As doping, and $BF_3$, $BCl_3$ and $B(CH_3)_3$ to provide for B doping.

For this gas-immersion laser annealing application, a short-wavelength melt laser 260, such as a XeCl excimer laser operating at a wavelength of 308 nm or a frequency tripled YAG laser operating at a wavelength of 355 nm, is desirable to provide high-photon energy for effective dissociation of gaseous dopant precursor 424. Example gas immersion laser doping systems and methods are described in U.S. Pat. Nos. 5,908,307; 5,888,888; 5,849,043; and 5316969, which are all incorporated by reference herein.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of annealing a semiconductor substrate having a patterned surface and a melt temperature, comprising:
   scanning at least one first laser beam over the patterned surface, the at least one first laser beam defining at least one non-melt line image at the patterned surface and being configured to heat the patterned surface to a non-melt temperature $T_{nonmelt}$ that is within 400° C. of the melt temperatures;
   scanning at least one second laser beam over the patterned surface and relative to the first laser beam, the at least one second laser beam defining at least one melt line image at the patterned surface and being pulsed and configured to heat the patterned surface from the non-melt temperature up to the melt temperature; and
   wherein the at least one non-melt line image has associated therewith a peak temperature axis corresponding to a maximum non-melt temperature of the patterned surface due to the scanning of the at least one first laser beam over the patterned surface, and including scanning the at least one non-melt and melt line images so that the at least one melt line image substantially resides along the peak-temperature axis of the at least one non-melt line image.

2. The method of claim 1, further comprising scanning the first laser beam to heat the patterned surface so that the non-melt temperature $T_{nonmelt}$ is between 50° C. and 400° C. below the melt temperature.

3. The method of claim 1, further comprising providing one of the at least one non-melt line image and the at least one melt line image to have a length that corresponds to a size of a region of the patterned surface.

4. The method of claim 1, further comprising stitching adjacent scans of the at least one first and the at least one second laser beams within gaps between IC chips.

5. The method of claim 1, further comprising performing the scanning of the at least one first and the at least one second laser beams so that each point of the patterned surface scanned by the at least one first laser beam receives at least one light pulse from the at least one second laser beam.

6. The method of claim 1, wherein the at least one first laser beam has a dwell time over the patterned surface during scanning of between 100 microseconds and 20 milliseconds.

7. The method of claim 1, further comprising generating the at least one first laser beam with a $CO_2$ laser.

8. The method of claim 1, wherein the at least one first laser beam is incident the patterned surface at a Brewster's angle.

9. The method of claim 1, further comprising determining a minimum non-melt temperature $T_{nonmelt}$ via the relationship:

$$\Delta T \approx \left(\frac{T_{melt} - T_{nonmelt}}{T_{melt} - T_{sub}}\right) \cdot \Delta T_{melt}$$

where $\Delta T$ is an acceptable amount of substrate surface temperature variation, $\Delta T_{melt}$ is a substrate surface temperature variation due to pattern density effects associated with conventional melt laser annealing, $T_{melt}$ is a melt temperature of the substrate, and $T_{sub}$ is an initial substrate surface temperature.

10. The method of claim 1, further comprising performing said at least one first and at least one second laser beam scannings with a gaseous dopant precursor adjacent the patterned surface.

11. The method of claim 1, further comprising scanning two first laser beams and scanning a single second laser beam.

12. The method of claim 1, further comprising disposing at least one of an absorber layer and an anti-reflectance layer atop the patterned surface.

13. The method of claim 1, wherein the patterned surface includes a dopant profile, and further comprising adjusting the dopant profile by adjusting at least one of a) the at least one first laser beam and b) the at least one second laser beam.

14. A method of laser annealing a substrate having a patterned surface and a melt temperature $T_{melt}$, comprising:
selecting a temperature variation $\Delta T$ for the patterned surface;
determining a minimum non-melt temperature $T_{nonmelt}$ via the relationship:

$$\Delta T \approx \left(\frac{T_{melt} - T_{nonmelt}}{T_{melt} - T_{sub}}\right) \cdot \Delta T_{melt}$$

where $\Delta T_{melt}$ is a patterned surface temperature variation due to pattern density effects that would arise using conventional single-beam melt laser annealing, and $T_{sub}$ is an initial temperature of the patterned surface;
performing laser annealing by scanning at least one first laser beam to pre-heat the patterned surface to a non-melt temperature in the range from the minimum non-melt temperature $T_{nonmelt}$ to a temperature of 50° C. below the melt temperature, and by scanning at least one second pulsed laser beam relative to the first laser beam to heat the patterned surface to the substrate melt temperature $T_{melt}$.

15. The method of claim 14, further comprising generating the at least one first laser beam using a $CO_2$ laser.

16. The method of claim 14, further comprising directing the at least one first laser beam relative to the patterned surface at a Brewster's angle for the substrate.

17. The method of claim 14, further comprising providing the at least one first laser beam with a p polarization.

18. The method of claim 14, further comprising providing the at least one second laser beam with a repetition rate of 1 KHz or greater.

19. The method of claim 14, further comprising generating the at least one second laser beam using one of an excimer laser, a diode-pumped solid-state laser and a q-switched laser, and a frequency-converted laser.

20. The method of claim 14, further comprising providing the at least one second laser beam with an amount of power between 20 W and 500 W.

21. The method of claim 14, further comprising scanning two first laser beams and scanning a single second laser beam.

22. The method of claim 14 further comprising performing said at least one first and at least one second laser beam scannings with a gaseous dopant precursor adjacent the patterned surface.

23. The method of claim 14, further comprising;
forming at the patterned surface at least one non-melt line image from the at least one first laser beam and at least one melt line image from the at least one second laser beam;
providing one of the at least one non-melt line image and the at least one melt line image to have a length that corresponds to a size of a region of the patterned surface.

24. The method of claim 23, further comprising stitching adjacent scans of the at least one non-melt line image and the at least one melt line image within gaps between IC chips on the patterned surface.

25. The method of claim 14, further comprising disposing at least one of an absorber layer and an anti-reflectance layer atop the patterned surface.

26. The method of claim 14, wherein the patterned surface includes a dopant profile, and further comprising adjusting the dopant profile by adjusting at least one of the at least one first laser beam and the at least one second laser beam.

27. A method of annealing a semiconductor substrate having a patterned surface with gaps between IC chips formed therein, and a melt temperature, comprising:
scanning at least one first laser beam over the patterned surface, the at least one first laser beam configured to heat the patterned surface to a non-melt temperature $T_{nonmelt}$ that is within 400° C. of the melt temperature; and
scanning at least one second laser beam over the patterned surface and relative to the first laser beam, the at least one second laser beam being pulsed and configured to heat the patterned surface from the non-melt temperature up to the melt temperature, including stitching adjacent scans of the at least one first and the at least one second laser beams within the gaps between the IC chips.

* * * * *